(12) United States Patent
Okumura et al.

(10) Patent No.: US 10,181,406 B2
(45) Date of Patent: *Jan. 15, 2019

(54) PLASMA PROCESSING APPARATUS, PLASMA PROCESSING METHOD, AND METHOD FOR MANUFACTURING ELECTRONIC DEVICE

(71) Applicant: Panasonic Intellectual Property Management Co., Ltd., Osaka (JP)

(72) Inventors: Tomohiro Okumura, Osaka (JP); Satoshi Suemasu, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/841,707

(22) Filed: Sep. 1, 2015

(65) Prior Publication Data

US 2016/0086774 A1 Mar. 24, 2016

(30) Foreign Application Priority Data

Sep. 19, 2014 (JP) .................................. 2014-190994

(51) Int. Cl.
| | | |
|---|---|---|
| *C23C 16/00* | (2006.01) | |
| *H01L 21/3065* | (2006.01) | |
| *H01J 37/32* | (2006.01) | |
| *H05H 1/30* | (2006.01) | |

(52) U.S. Cl.
CPC ........ *H01L 21/3065* (2013.01); *H01J 37/321* (2013.01); *H01J 37/32798* (2013.01);
(Continued)

(58) Field of Classification Search
CPC ................ H01J 37/321; H01J 37/3211; H01J 37/32119; H01J 37/32128;
(Continued)

(56) References Cited

U.S. PATENT DOCUMENTS 5,711,814 A 1/1998 Mori
9,741,538 B2* 8/2017 Okumura .......... H01J 37/32009
(Continued)

FOREIGN PATENT DOCUMENTS

CN 102782817 A 11/2012
JP 2002-231642 8/2002
(Continued)

OTHER PUBLICATIONS

T. Okumura and H. Kawaura, "Elongated Inductively Coupled Thermal Plasma Torch Operable at Atmospheric Pressure" Jpn. J. Appl. Phys. 52 (2013) 05EE01.
(Continued)

*Primary Examiner* — Luz L Alejandro Mulero
(74) *Attorney, Agent, or Firm* — Panasonic IP Management; Kerry S. Culpepper

(57) ABSTRACT

In an inductively-coupled plasma torch unit, a coil, a first ceramic block, and a second ceramic block are arranged parallel to one another, and an elongated chamber has an annular shape. Plasma generated inside the chamber is ejected toward a substrate through an opening portion in the chamber. The substrate is processed by relatively moving the elongated chamber and the substrate in a direction perpendicular to a longitudinal direction of the opening portion. A rotating ceramic pipe having a cylindrical shape is provided so as to cause a refrigerant to flow into a cavity formed inside the ceramic pipe. Accordingly, it becomes possible to apply greater high-frequency power, thereby enabling fast plasma processing.

6 Claims, 12 Drawing Sheets

(52) U.S. Cl.
CPC .......... *H05H 1/30* (2013.01); *H01J 2237/002* (2013.01); *H01J 2237/0206* (2013.01)

(58) Field of Classification Search
CPC .......... H01J 37/32137; H01J 37/32146; H01J 37/32155; H01J 37/32165; H01J 37/32174; H01J 37/32183; H01J 37/32082; H01J 37/32091; H01J 37/32064; H01J 37/32055; H01J 37/32073
USPC ...... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 2011/0115378 A1* | 5/2011 | Lubomirsky | ........ | H01J 37/3211 315/111.21 |
| 2012/0325777 A1* | 12/2012 | Okumura | ................ | H05H 1/30 216/68 |
| 2013/0115780 A1 | 5/2013 | Okumura et al. | | |
| 2013/0230990 A1 | 9/2013 | Okumura et al. | | |
| 2014/0220784 A1 | 8/2014 | Okumura et al. | | |
| 2014/0312761 A1 | 10/2014 | Tamagaki | | |

FOREIGN PATENT DOCUMENTS

| | | |
|---|---|---|
| JP | 3509758 B | 3/2004 |
| JP | 2013-045822 | 3/2013 |
| JP | 2013-120633 | 6/2013 |
| JP | 2013-120684 | 6/2013 |
| JP | 2013-120685 | 6/2013 |
| JP | 2013-131485 | 7/2013 |
| JP | 2013-211244 A | 10/2013 |
| WO | 2011/142125 | 11/2011 |

OTHER PUBLICATIONS

English Translation of Chinese Search Report dated Feb. 4, 2017 for the related Chinese Patent Application No. 201510535288.7.

* cited by examiner

PLASMA PROCESSING APPARATUS, PLASMA PROCESSING METHOD, AND METHOD FOR MANUFACTURING ELECTRONIC DEVICE

TECHNICAL FIELD

The technical field relates to a plasma processing apparatus, a plasma processing method, and a method for manufacturing an electronic device, in which thermal plasma processing for a substrate is performed by emitting thermal plasma to the substrate, or in which low-temperature plasma processing for the substrate is performed by emitting plasma using reactive gas or by concurrently emitting the plasma with a reactive gas flow.

BACKGROUND

In the related art, a semiconductor thin film such as polycrystalline silicon (poly-Si) is widely used for a thin film transistor (TFT) or solar cells. As a method for inexpensively forming the semiconductor thin film, the semiconductor thin film is crystallized by emitting laser beams to an amorphous silicon film. A laser process can also be applied to activation of impure atoms introduced into a semiconductor substrate by means of ion implantation or plasma doping. However, this laser annealing technique has a disadvantage in that an attainable temperature greatly varies or a seam appears depending on whether a heating object absorbs light much, or a little, and additionally requires very expensive equipment.

Therefore, a technique has been studied in which heating can be performed by generating elongated thermal plasma and by performing scanning in only one direction without depending on light absorption by the heating object, and in which thermal processing is inexpensively and seamlessly performed (for example, refer to JP-A-2013-120633, JP-A-2013-120684, and JP-A-2013-120685, and T. Okumura and H. Kawaura, Jpn. J. Appl. Phys. 52 (2013) 05EE01).

SUMMARY

In the technique for generating elongated thermal plasma disclosed in JP-A-2013-120633, JP-A-2013-120684, and JP-A-2013-120685 in the related art employed for use in performing high-temperature processing in the vicinity of a substrate surface within a very short time, such as semiconductor crystallization, if high-frequency power is excessively increased in order to increase plasma emitting intensity, a plasma source is damaged by heat. Thus, it is necessary to suppress the high-frequency power. As a result, there is a problem of delayed processing speed (the number of substrates which can be processed per unit time).

In view of this problem, as well as other concerns, an object thereof is to provide a plasma processing apparatus, a plasma processing method, and a method for manufacturing an electronic device in which when high-temperature thermal processing is uniformly performed in the vicinity of a substrate surface within a very short time, or when low-temperature plasma processing for a substrate is performed by emitting plasma using reactive gas or by concurrently emitting the plasma with a reactive gas flow, fast processing can be performed, and the plasma can be stably utilized.

According to a first aspect, a plasma processing apparatus includes a dielectric member surrounding an elongated and annular chamber except for an opening portion and communicates with the opening portion, a portion configuring a surface which opposes a substrate mounting table for mounting a substrate is configured to include a cylinder which is arranged parallel to a longitudinal direction of the chamber.

According to this configuration, since the dielectric member is less likely to be damaged even when receiving high power, fast processing can be performed, and plasma can be stably utilized.

According to a second aspect, there is provided a plasma processing method. Within a dielectric member surrounding an elongated and annular chamber, a portion configuring a surface which opposes a substrate mounting table for mounting a substrate is configured to include a cylinder which is arranged parallel to a longitudinal direction of the chamber.

According to this configuration, since the dielectric member is less likely to be damaged even when receiving high power, fast processing can be performed, and plasma can be stably utilized.

According to a third aspect, there is provided a method for manufacturing an electronic device by using the plasma processing method according to the second aspect.

According to this configuration, since the dielectric member is less likely to be damaged even when receiving high power, fast processing can be performed, and plasma can be stably utilized.

Accordingly, when high-temperature thermal processing is uniformly performed, in the vicinity of a substrate surface within a very short time, or when plasma processing for a substrate is performed by emitting plasma using reactive gas or by concurrently emitting the plasma with a reactive gas flow, fast processing can be performed, and the plasma can be stably utilized.

DESCRIPTION OF EMBODIMENTS

Hereinafter, a plasma processing apparatus according to various embodiments will be described, with reference to the accompanying drawings.

Embodiment 1

Hereinafter, Embodiment 1 will be described with reference to FIGS. 1A to 3.

Figure 1A:
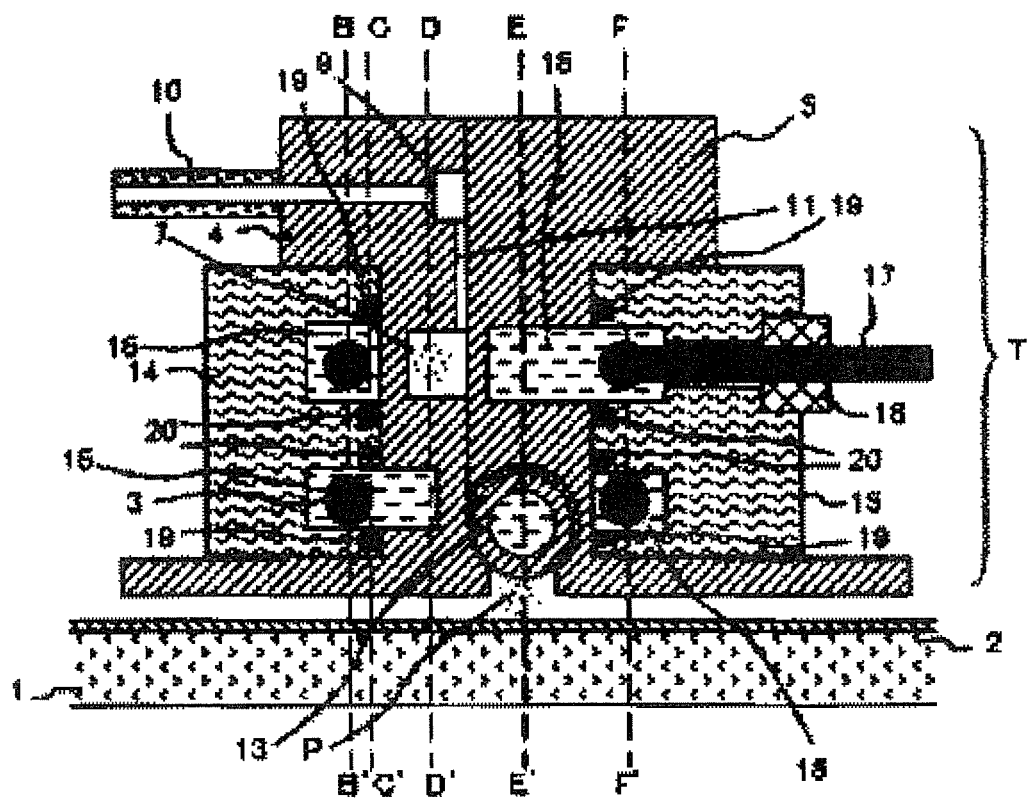
FIGS. 1A to 1F are sectional views illustrating a configuration of a plasma processing apparatus according to Embodiment 1.

FIG. 1A illustrates a configuration of a plasma processing apparatus according to Embodiment 1, and is a sectional view taken along a plane which is perpendicular to a longitudinal direction of an elongated inductively-coupled plasma torch unit and passes through dotted line A-A' in FIGS. 1B to 1F.

Figure 1B:
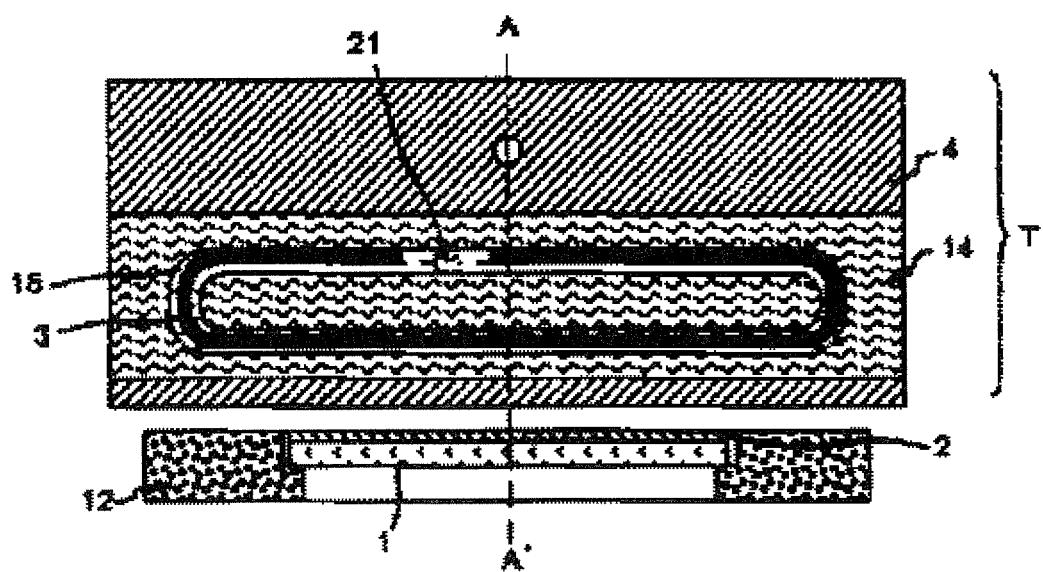
Figure 1C:
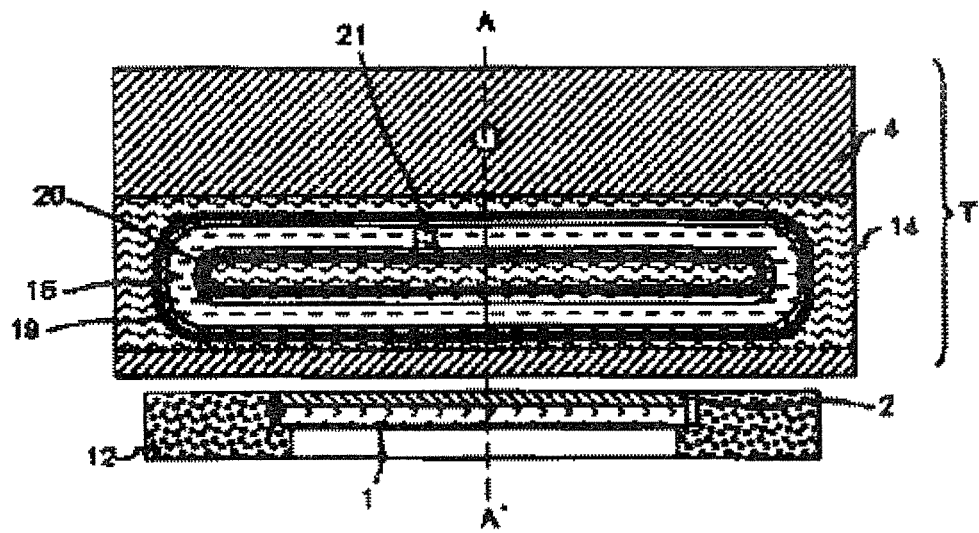
Figure 1D:
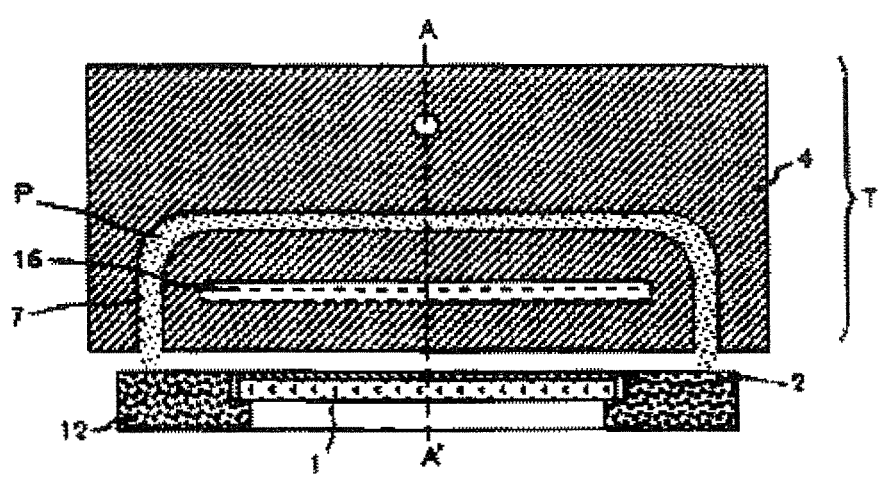
Figure 1E:
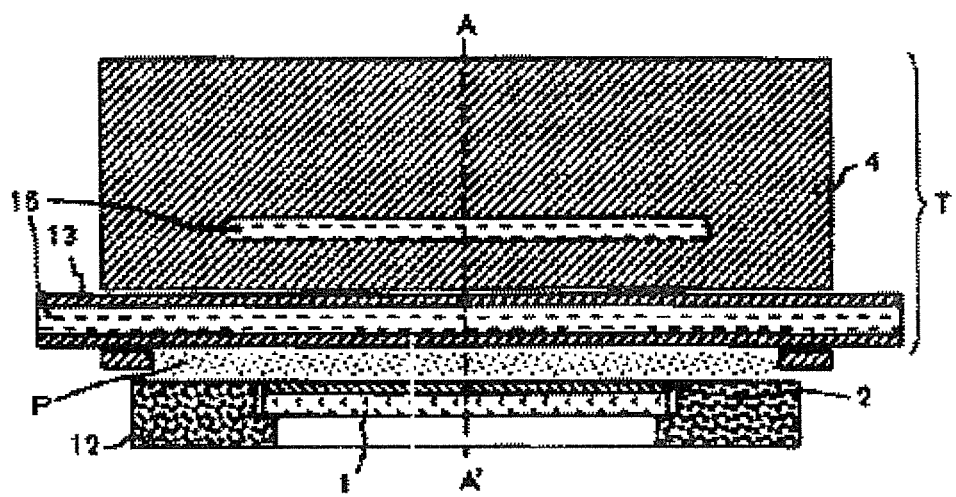
Figure 1F:
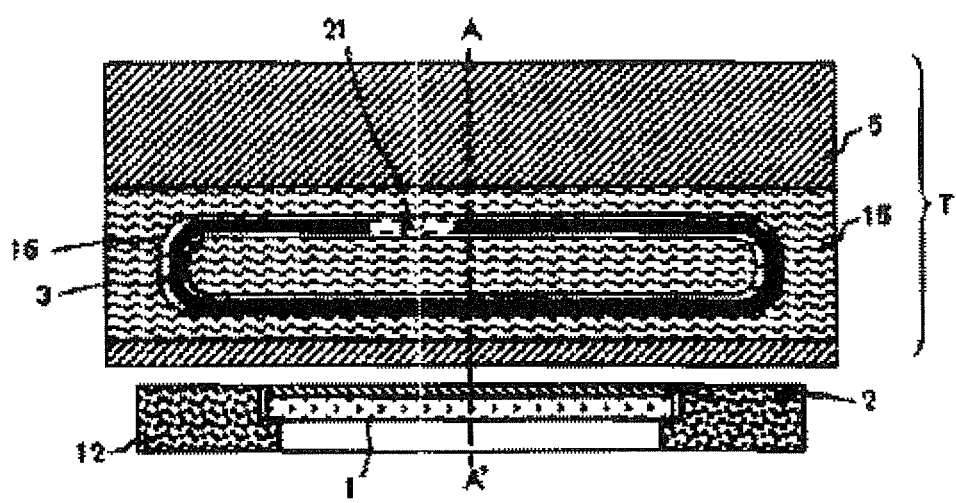

FIGS. 1B to 1F are sectional views taken along a plane which is parallel to the longitudinal direction of the elongated inductively-coupled plasma torch unit and passes through dotted lines in FIG. 1A, FIG. 1B is a sectional view taken along clotted line B-B' in FIG. 1A, FIG. 1C is a sectional view taken along dotted line C-C' in FIG. 1A, FIG. 1D is a sectional view taken along dotted line D-D' in FIG. 1A, FIG. 1E is a sectional view taken along dotted line E-E' in FIG. 1A, and FIG. 1F is a sectional view taken, along dotted line F-F' in FIG. 1A.

Figure 2:
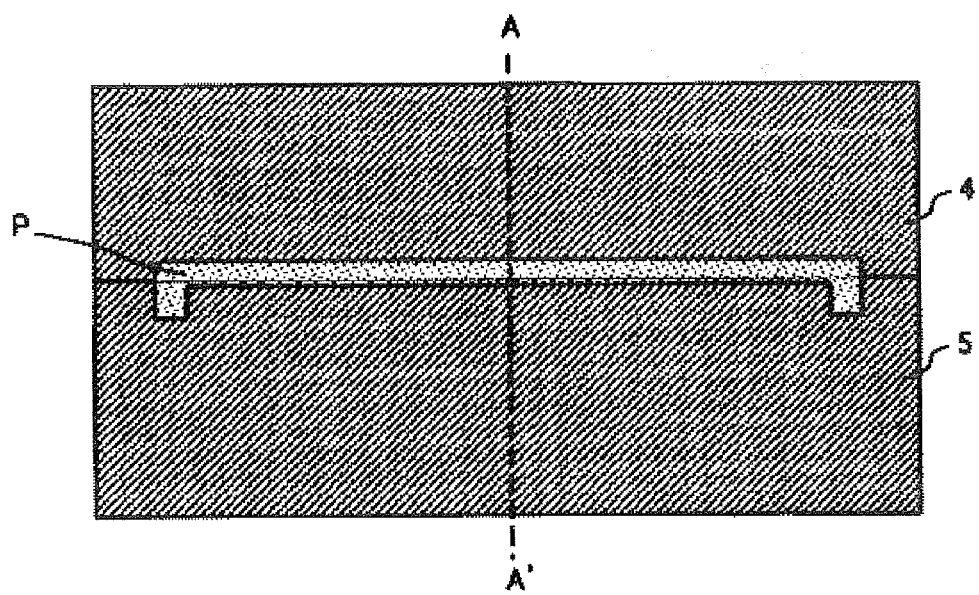
FIG. 2 is a plan view illustrating a configuration of the plasma processing apparatus according to Embodiment 1.
Figure 3:
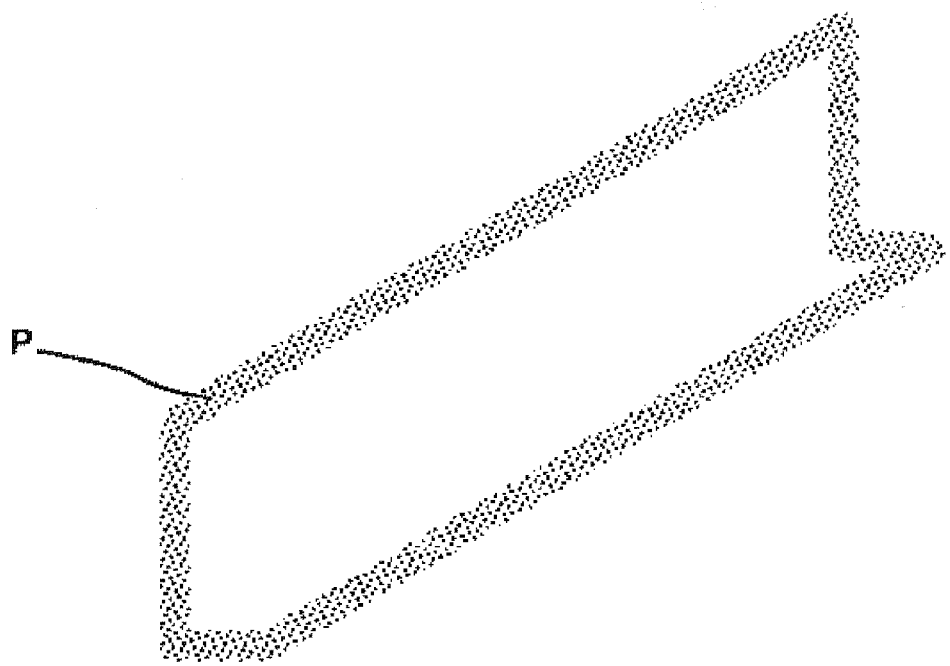
FIG. 3 is a perspective view illustrating a plasma generating region according to Embodiment 1.

FIG. 2 is a plan view when the inductively-coupled plasma torch unit illustrated in FIGS. 1A to 1F is viewed upward from below in FIGS. 1A to 1F. FIG. 3 is a perspective view illustrating a plasma generating region, and is a view when the inductively-coupled plasma torch unit is viewed in an obliquely downward direction from the front right side in FIG. 1A.

Referring to FIGS. 1A to 1F, substrate 1 is arranged on a tray functioning as substrate mounting table 12, and thin film 2 is arranged on substrate 1. In inductively-coupled plasma torch unit T, coil 3 made of a conductor is arranged in the vicinity of first ceramic block 4 and second ceramic block 5. Elongated chamber 7 is defined, by a space surrounded with first ceramic block 4, second ceramic block 5, and substrate mounting table 12 (alternatively, substrate 1 thereon).

Substrate 1 is arranged on the tray functioning as substrate mounting table 12. Coil 3 and chamber 7 are arranged along a plane which is substantially perpendicular to a plane formed by substrate mounting table 12. An inner wall surface of chamber 7 which is close to coil 3 is a plane substantially parallel to coil 3. According to this configuration, distances from coil 3 to chamber 7 are equal to each other in any place where coil 3 is arranged. Therefore, smaller high-frequency power can generate inductively-coupled plasma, and thus plasma can be efficiently generated.

Inductively-coupled plasma torch unit T is entirely surrounded with a shield member (not illustrated) made of a grounded conductor. In this manner, it is possible to effectively prevent high-frequency leakage (noise), and it is possible to effectively prevent undesirable abnormal discharge.

Chamber 7 is surrounded with an annular groove in which a groove disposed in first ceramic block 4 and second ceramic block 5 is continuous. That is, a configuration is adopted in which chamber 7 is entirely surrounded with a dielectric member. Chamber 7 has an annular shape.

The annular shape described herein means a continuously closed string shape. In the present embodiment, chamber 7 has the continuously closed string shape formed by connecting a linear portion forming a long side disposed in first ceramic block 4, linear portions forming two short sides arranged in both ends of the above-described linear portion disposed in first ceramic block 4, and a linear portion forming a long side disposed at the bottom of second ceramic block 5.

Plasma P generated in chamber 7 is ejected toward substrate 1 from a plasma ejection port (opening portion having a linear shape forming the long side disposed at the bottom of second ceramic block 5) which forms the bottom portion of chamber 7. The longitudinal direction of chamber 7 and the longitudinal direction of the plasma election port are arranged parallel to each other.

A rectangular groove disposed in first ceramic block 4 is gas manifold 9, and internally has a porous ceramic material fitted therein. Gas supplied to gas manifold 9 from gas supply pipe 10 is introduced into chamber 7 via gas supply hole 11 (through-hole) serving as a gas inlet portion disposed in first ceramic block 4. According to this configuration, the gas can uniformly and easily flow in the longitudinal direction. A flow rate of the gas introduced into gas supply pipe 10 is controlled by providing a flow rate control device such as a mass flow controller on an upstream side thereof.

Gas manifold 9 is configured to internally include the porous ceramic material. In this manner, it is possible to achieve a uniform gas flow, and it is possible to prevent abnormal discharge in the vicinity of gas manifold 9.

Gas supply hole 11 is configured so that multiple round holes are disposed in the longitudinal direction. However, slit-shaped elongated holes may be disposed in the longitudinal direction.

Cylindrical ceramic pipe 13 is disposed between first ceramic block 4 and second ceramic block 5. An upper surface of the bottom portion of chamber 7 is configured to include ceramic pipe 13. That is, a portion configuring a surface which opposes substrate mounting table 12 within a dielectric member surrounding chamber 7 is configured to include a cylinder arranged parallel to the longitudinal direction of chamber 7.

There is provided a rotary mechanism for rotating ceramic pipe 13 around an axis thereof. Furthermore, ceramic pipe 13 has a cavity formed thereinside, and includes a mechanism for causing a refrigerant to flow into the cavity formed thereinside. As illustrated in FIG. 1E, ceramic pipe 13 is longer than the length of chamber 7 in the longitudinal direction. The rotary mechanism (not illustrated) is arranged at a position which is sufficiently far away from chamber 7. It is desirable to dispose a very precise rotation guide for the rotary mechanism so that a shape of chamber 7 is not changed due to the rotation of ceramic pipe 13. Rotational power of a motor is transmitted by a mechanism such as a belt drive.

Ceramic pipe 13 can employ a rotary joint so as to be rotatable while causing the refrigerant to flow thereinside.

Coil 3 is configured so that a copper pipe having a circular shape in a section thereof is arranged inside refrigerant flow path 16 surrounded with first ceramic block 4, third ceramic block 14, second ceramic block 5, and fourth ceramic block 15. Coil 3 may be configured to include a hollow pipe, and the refrigerant may be supplied and discharged via a system separated from refrigerant flow path 16.

In this way, coil 3 and each ceramic component can be cooled by causing the refrigerant such as water to flow in refrigerant flow path 16. First ceramic block 4 and second ceramic block 5 require excellent heat resistance. Accordingly, as a material for both of these, it is suitable to use ceramics mainly containing silicon nitride, or ceramics mainly containing silicon, aluminum, oxygen, and nitrogen. Third ceramic block 14 and fourth ceramic block 15 do not require the heat resistance to be as high. Accordingly, it is possible to use relatively inexpensive ceramics such as aluminum oxide (alumina).

Power is supplied to coil 3 by copper rod 17 functioning as a power supply rod, via a through-hole disposed in third ceramic block 14 and fourth ceramic block 15. Copper rod 17 is fixed to third ceramic block 14 and fourth ceramic block 15 by joint 18, and is configured so that the refrigerant does not leak out therefrom. Outer O-ring 19 and inner O-ring 20 are respectively arranged between first ceramic block 4 and third ceramic block 14, and between second ceramic block 5 and fourth ceramic block 15, and are configured so that the refrigerant does not leak out therefrom.

As illustrated in FIGS. 1B and 1F, coil 3 has a rectangular planar shape as a whole. Refrigerant flow path 16 is internally partitioned by partition 21, and forms a continuous flow path. A configuration is adopted in which a direction of high-frequency current flowing in coil 3 is parallel to a flow direction of the refrigerant flowing in refrigerant flow path 16.

As illustrated in FIGS. 2 and 3, generated plasma P has the same shape as an outer edge of a three-dimensional structure in which two rectangles whose lengths in the longitudinal direction are equal to each other are joined in an L-shape. In this way, as compared to the related art, plasma P has a somewhat distorted shape. The reason is that it is necessary to arrange chamber 7 so as not to interfere with ceramic pipe 13.

While plasma gas is supplied into chamber 7, the gas is ejected toward substrate 1 through an opening portion, and high-frequency power is supplied to coil 3 from a high-frequency power source (not illustrated), thereby generating plasma P in chamber 7. Plasma processing can be performed for thin film 2 on substrate 1 by emitting plasma P to substrate 1 through the opening portion. Substrate 1 is subjected to processing by relatively moving chamber 7 and substrate mounting table 12 in a direction perpendicular to the longitudinal direction of the opening portion. That is, inductively-coupled plasma torch unit T or substrate mounting table 12 is moved in rightward and leftward directions as shown in FIGS. 1A to 1F.

When a distance between inductively-coupled plasma torch unit T and substrate 1 is shortened in order to perform efficient processing on substrate 1, an inner wall surface of chamber 7 in the vicinity of substrate mounting table 12, which is a portion opposite to substrate mounting table 12 (portion opposing substrate mounting table 12), receives the largest amount of heat. Accordingly, it is necessary to effectively cool the portion in order to suppress damage. Therefore, the present embodiment adopts a configuration of using ceramic pipe 13 which internally includes refrigerant flow path 16. Strength can be reliably reinforced, and internal pressure can be increased by forming ceramic pipe 13 in a cylindrical shape. Accordingly, much more cooling water can flow therethrough.

A configuration is adopted in which surfaces receiving heat from plasma P are always replaced with one another by rotating ceramic pipe 13. That is, a portion which becomes hot after receiving the heat from plasma P is rapidly cooled after the rotation of ceramic pips 13 causes the portion to quickly move to a position where the portion does not receive the heat from plasma P. Therefore, unlike in the related art, it becomes possible to apply significantly greater high-frequency power, thereby enabling fast plasma processing.

Various types of plasma gas can be used as plasma gas to be supplied into chamber 7. However, in view of stability and ignitability of plasma, or durability of a member to be exposed to the plasma, it is desirable to use materials mainly containing inert gas and, particularly noble gas. Among the materials, Ar gas is typically used. When the plasma is generated by using only Ar gas, the plasma becomes considerably hot (10,000 K or higher).

In the plasma processing apparatus as described above, while Ar gas or Ar+H2 gas serving as the plasma gas is supplied into chamber 7, the gas is ejected to substrate 1 through an opening portion, and high-frequency power of 13.56 MHz is supplied to coil 3 from a high-frequency power source. In this manner, a high-frequency electromagnetic field is generated in chamber 7, thereby generating plasma P. Plasma P is emitted to substrate 1 through the opening portion so as to perform scanning. Accordingly, it is possible to perform thermal processing such as crystallization of a semiconductor film.

Appropriate conditions for generating plasma are set to approximately have values of the distance between opening portion and substrate 1=0.1 mm to 5 mm, scanning speed=20 mm/s to 3,000 mm/s, total flow rate of plasma gas=1 SLM to 100 SLM, H2 concentration in Ar+H2 gas=0% to 10%, and high-frequency power=0.5 kW to 30 kW. However, among these amounts, the flow rate of the gas and the power are indicated, by a value per length of 100 mm of the opening portion. The reason is that it is considered appropriate to input an amount which is proportional to the length of the opening portion, when determining parameters of the flow rate of the gas and the power.

As described above, according to the present embodiment, it is possible to input greater high-frequency power. That is, when high-temperature thermal processing is uniformly performed in the vicinity of a substrate surface for a very short period of time, or when low-temperature plasma processing for a substrate is performed by emitting plasma using reactive gas or by concurrently emitting the plasma with a reactive gas flow, fast processing can be performed, and the plasma can be stably utilized. That is, since the apparatus can be operated using greater power, plasma emitting intensity can be increased. As a result, processing speed (the number of substrates which can be processed per unit of time) becomes higher.

Embodiment 2

Hereinafter, Embodiment 2 will be described with reference to FIGS. 4A and 4B.

Figure 4A:
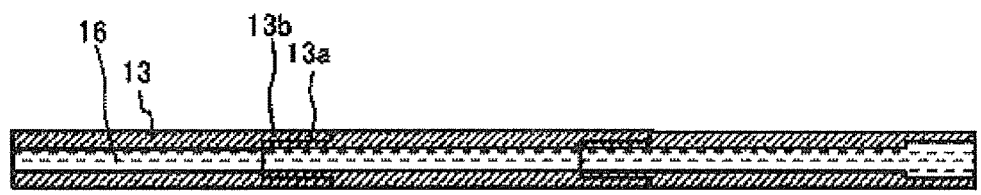
FIGS. 4A and 4B are sectional views illustrating a configuration of a plasma processing apparatus according to Embodiment 2.

FIG. 4A is a sectional view illustrating a configuration of a plasma processing apparatus according to Embodiment 2, and illustrates a section in which ceramic pipe 13 is cut along a plane perpendicular to the longitudinal direction.

Referring to FIG. 4A, ceramic pipe 13 is configured to include multiple pipes provided with convex portion 13a and concave portion 13b. A screw-tap is formed in convex portion 13a and concave portion 13b. Convex portion 13a is configured to be screwed into concave portion 13b in a state where a sealing material is interposed therebetween by winding a sealing tape therearound. In order to configure a simple and compact inductively-coupled plasma torch unit T, it is preferable to use thin ceramic pipe 13.

However, ceramic materials are likely to crack or be distorted during a manufacturing process thereof. Consequently, it is difficult to finish a long pipe finely and very precisely. The present embodiment employs a structure in which relatively short components are finished finely and very precisely, and are joined together in the longitudinal direction of chamber 7.

According to this configuration, it is possible to configure an inexpensive plasma processing apparatus.

Figure 4B:

FIG. 4B illustrates an example of further another configuration of ceramic pipe 13.

Referring to FIG. 4B, flow path adjustment member 31 having a rod shape is inserted into a hollow portion of ceramic pipe 13. This allows refrigerant flow path 16 to have a narrower sectional area. When the refrigerant is supplied at the same flow rate, flow velocity increases. Accordingly, heat can be more efficiently removed from the inner wall surface of ceramic pipe 13 whose temperature increases. That is, according to this configuration, it is possible to further improve cooling efficiency, it is desirable to arrange flow path adjustment member 31 so as to be coaxial with ceramic pipe 13. Flow path adjustment member 31 may be appropriately positioned by using set crews in three directions or four directions.

Embodiment 3

Hereinafter, Embodiment 3 will be described with reference to FIGS. 5A to 6.

Figure 5A:
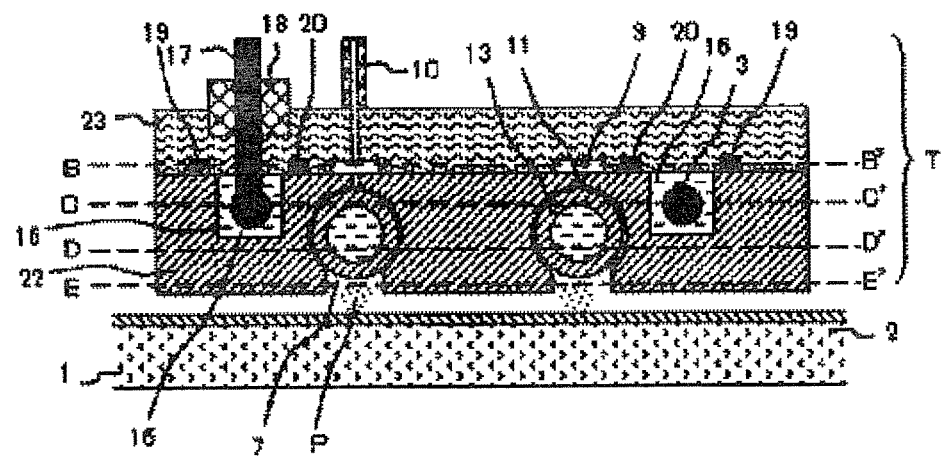
FIGS. 5A to 5E are sectional views illustrating a configuration of a plasma processing apparatus according to Embodiment 3.
Figure 5B:
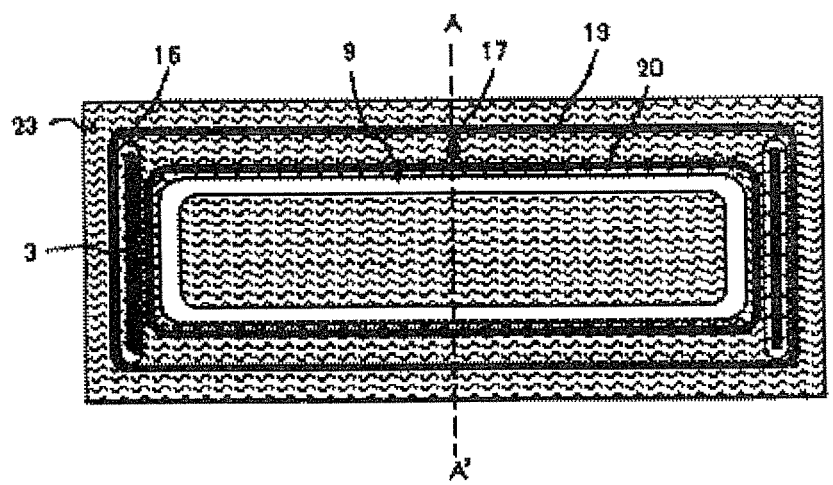
Figure 5C:
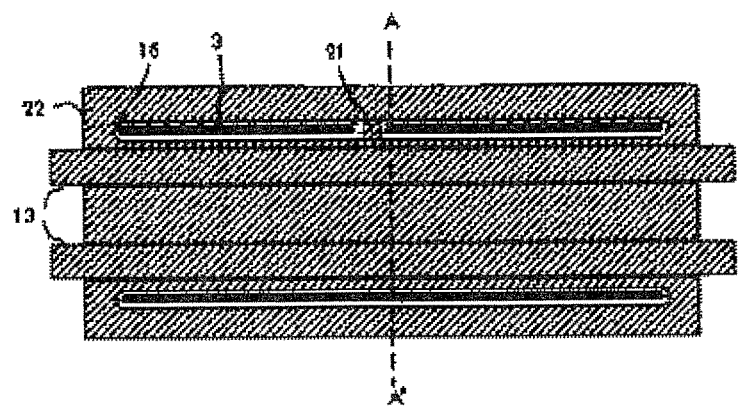
Figure 5D:
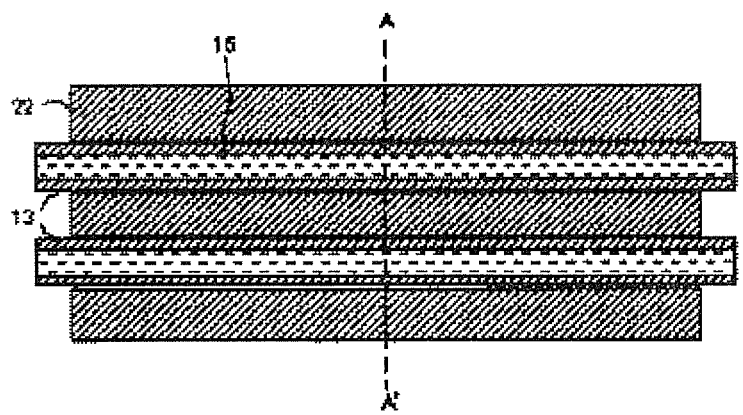
Figure 5E:
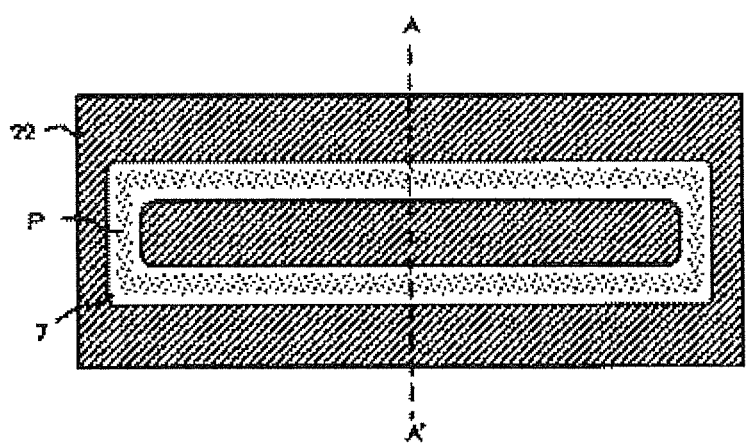

FIG. 5A illustrates a configuration of a plasma processing apparatus according to Embodiment 3, and is a sectional view taken along a plane which is perpendicular to the longitudinal direction of the elongated inductively-coupled plasma torch unit and passes through dotted line A-A' in FIGS. 5B to 5E. FIGS. 5B to 5E are sectional views taken along a plane which is parallel to the longitudinal direction of the elongated inductively-coupled plasma torch unit and passes through dotted lines in FIG. 5A. FIG. 5B is a sectional view taken along dotted line B-B' in FIG. 5A. FIG. 5C is a sectional view taken along dotted line C-C in FIG. 5A. FIG. 5D is a sectional view taken along dotted line D-D' in FIG. 5A. FIG. 5E is a sectional view taken along dotted line E-E' in FIG. 5A. FIG. 6 is a perspective view illustrating the shape of coil 3, and is a view when coil 3 is viewed in an obliquely downward direction from the front right side in FIG. 5A.

Referring to FIGS. 5A to 5E, thin film 2 is arranged on substrate 1 mounted on substrate mounting table 12 (not illustrated). In inductively-coupled plasma torch unit T, coil 3 made of a conductor is arranged in the vicinity of first ceramic block 22 and second ceramic block 23. Elongated chamber 7 is defined by a space surrounded with first ceramic block 22 and substrate 1.

Coil 3 and chamber 7 are arranged along a plane which is substantially parallel to a plane formed by substrate mounting table 12. According to this configuration, distances from coil 3 to chamber 7 are substantially equal to each other in any place where coil 3 is arranged. Therefore, smaller high-frequency power can generate inductively-coupled plasma, and thus plasma can be efficiently generated.

Inductively-coupled plasma torch unit T is entirely surrounded with a shield member (not illustrated) made of a grounded conductor. In this manner, it is possible to effectively prevent high-frequency leakage (noise), and it is possible to effectively prevent undesirable abnormal discharge.

Chamber 7 is surrounded with an annular groove in which a groove disposed in first ceramic block 22 is continuous. That is, a configuration is adopted in which chamber 7 is entirely surrounded with a dielectric member. Chamber 7 has an annular shape. The annular shape described herein means a continuously closed string shape, and is not limited to a rectangular shape as illustrated in FIG. 5E. In the present embodiment, chamber 7 having a racetrack shape (continuously closed string shape formed by connecting straight lines which form two short sides to both ends of linear portions which form two long sides) is illustrated as an example. Plasma P generated in chamber 7 is ejected toward substrate 1 through a plasma ejection port serving as an opening portion in chamber 7.

The longitudinal direction of chamber 7 and the longitudinal direction of the opening portion serving as the plasma ejection port are arranged so as to be parallel to each other.

An annular groove disposed in second ceramic block 23 is gas manifold 9, and internally has a porous ceramic material fitted therein. Gas supplied to gas manifold 9 from gas supply pipe 10 is introduced into chamber 7 via gas supply hole 11 (through-hole) serving as a gas inlet portion disposed in first ceramic block 22. According to this configuration, the gas can uniformly and easily flow in the longitudinal direction. A flow rate of the gas introduced into gas supply pipe 10 is controlled by providing a flow rate control device such as a mass flow controller on an upstream side thereof.

Gas manifold 9 is configured to internally include a porous ceramic material. In this manner, it is possible to achieve a uniform gas flow, and it is possible to prevent abnormal discharge in the vicinity of gas manifold 9.

Gas supply hole 11 is configured so that multiple round holes are disposed in the longitudinal direction thereof. However, slit-shaped elongated holes may be disposed in the longitudinal direction thereof.

Cylindrical ceramic pipe 13 is disposed in the groove provided in first ceramic block 22. An upper surface of the long side portion of chamber 7 is configured to include ceramic pipe 13. That is, a portion configuring a surface which opposes substrate mounting table 12 within a dielectric member surrounding the long side portion of chamber 7 is configured to include a cylinder arranged parallel to the longitudinal direction of chamber 7.

There is provided a rotary mechanism for rotating ceramic pipe 13 around an axis thereof. Furthermore, ceramic pipe 13 has a cavity formed thereinside, and includes a mechanism for causing the refrigerant to flow into the cavity formed thereinside. As illustrated in FIGS. 5C and 5D, ceramic pipe 13 is longer than chamber 7 in the longitudinal direction. The rotary mechanism (not illustrated) is arranged at a position which is sufficiently far away from chamber 7. It is desirable to dispose a very precise rotation guide for the rotary mechanism so that the shape of chamber 7 is not changed due to the rotation of ceramic pipe 13. Rotational power of a motor is transmitted by a mechanism such as a belt drive. Ceramic pipe 13 can employ a rotary joint so as to be rotatable while causing the refrigerant to flow thereinside.

Coil 3 is configured so that a copper pipe having a circular shape in a section is arranged inside refrigerant flow path 16 surrounded with first ceramic block 22 and second ceramic block 23. Coil 3 may be configured to include a hollow pipe, and the refrigerant may be supplied and discharged via a system separated from refrigerant flow path 16. In this way, coil 3 and each ceramic component can be cooled by causing a refrigerant such as water to flow in refrigerant flow path 16. First ceramic block 22 requires excellent heat resistance. Accordingly, as a material for first ceramic block 22, it is suitable to use ceramics mainly containing silicon nitride, or ceramics mainly containing silicon, aluminum, oxygen, and nitrogen. Second ceramic block 23 does not require the heat resistance to be as high. Accordingly, it is possible to use relatively inexpensive ceramics such as aluminum oxide (alumina).

Power is supplied to coil 3 by copper rod 17 functioning as a power supply rod, via a through-hole disposed in second ceramic block 23. Copper rod 17 is fixed to second ceramic block 23 by joint 18, and is configured so that the refrigerant does not leak out therefrom. Outer O-ring 19 and inner O-ring 20 are arranged between first ceramic block 22 and second ceramic block 23, and are configured so that the refrigerant does not leak out therefrom.

Figure 6:
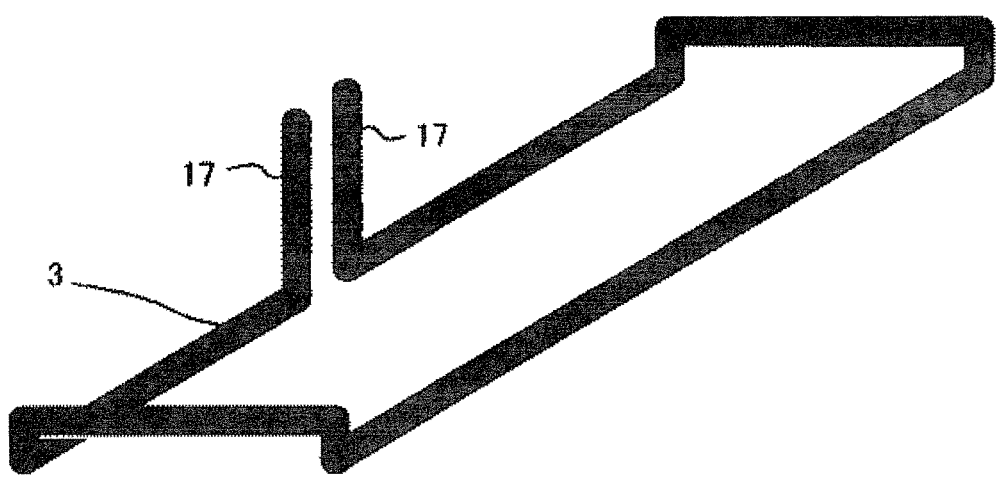
FIG. 6 is a perspective view illustrating a configuration of the plasma processing apparatus according to Embodiment 3.

As illustrated in FIGS. 5B, 5C, and 6, coil 3 has a shape in which two long sides, two short sides arranged at a position farther from substrate 1 than the long sides, and a line segment in the vertical direction connecting the long side and the short side are joined together. In this way, as compared to the related art, coil 3 has a somewhat more distorted shape. The reason is that it is necessary to arrange coil 3 so as not to interfere with ceramic pipe 13.

Refrigerant flow path 16 also extends along coil 3, and has the same shape. As illustrated in FIG. 5C, refrigerant flow path 16 is internally partitioned by partition 21, and forms a continuous flow path. A configuration is adopted in which the direction of high-frequency current flowing in coil 3 is parallel to the flowing direction of the refrigerant flowing in refrigerant flow path 16.

While plasma gas is supplied into chamber 7, the gas is ejected toward substrate 1 through an opening portion, and high-frequency power is supplied to coil 3 from a high-frequency power source (not illustrated), thereby generating plasma P in chamber 7. Plasma processing can be performed for thin film 2 on substrate 1 by emitting plasma P to substrate 1 through the opening portion. Substrate 1 is subjected to processing by relatively moving chamber 7 and substrate mounting table 12 in the direction perpendicular to the longitudinal direction of the opening portion. That is, inductively-coupled plasma torch unit T or substrate mounting table 12 is moved in rightward and leftward directions in FIGS. 5A to 5E.

When a distance between inductively-coupled plasma torch unit T and substrate 1 is shortened in order to perform efficient processing on substrate 1, an inner wall surface of chamber 7 in the vicinity of substrate mounting table 12, which is a portion opposite to substrate mounting table 12 (portion opposing substrate mounting table 12), receives the largest amount of heat. Accordingly, it is necessary to effectively cool the portion in order to suppress damage. Therefore, the present embodiment adopts a configuration of using ceramic pipe 13 which internally includes refrigerant flow path 16. Strength can be reliably reinforced, and internal pressure can be increased by forming ceramic pipe 13 in a cylindrical shape. Accordingly, much more cooling water can flow therethrough.

A configuration is adopted in which surfaces receiving heat from plasma P are always replaced with one another by rotating ceramic pipe 13. That is, a portion which becomes hot after receiving the heat from plasma P is rapidly cooled after the rotation of ceramic pipe 13 causes the portion to quickly move to a position where the portion does not receive the heat from plasma P. Therefore, unlike in the related art, it becomes possible to apply significantly greater high-frequency power, thereby enabling fast plasma processing.

Various types of plasma gas can be used as plasma gas to be supplied into chamber 7. However, in view of stability and ignitability of plasma, or durability of a member to be exposed to the plasma, it is desirable to use materials mainly containing inert gas and particularly noble gas. Among the materials, Ar gas is typically used. When the plasma is generated by using only Ar gas, the plasma becomes considerably not (10,000 K or higher).

In this configuration, the length of the opening portion in the longitudinal direction is equal to or greater than the width of substrate 1. Accordingly, single scanning (relatively moving inductively-coupled plasma torch unit T and substrate 1 (or substrate mounting table for mounting substrate 1)) can process overall thin film 2 in the vicinity of the surface of substrate 1. According to this configuration, plasma on the short side of the opening portion which forms a rectangular shape as a whole is not emitted to the substrate, thereby enabling uniform processing.

In the plasma processing apparatus as described above, while Ar gas or Ar+H2 gas serving as the plasma gas is supplied into chamber 7, the gas is elected to substrate 1 through the opening portion, and high-frequency power of 13.56 MHz is supplied to coil 3 from a high-frequency power source (not illustrated). In this manner, a high-frequency electromagnetic field is generated in chamber 7, thereby generating plasma P. Plasma P is emitted to substrate 1 through the opening portion so as to perform scanning. Accordingly, it is possible to perform thermal processing such as crystallization of a semiconductor film.

Appropriate conditions for generating plasma are set to approximately have values of distance between opening portion and substrate 1=0.1 mm to 5 mm, scanning speed=20 mm/s to 3,000 mm/s, total flow rate of plasma gas=1 SLM to 100 SLM, H2 concentration in Ar+H2 gas=0% to 10%, and high-frequency power=0.5 kW to 30 kW. However, among these amounts, the flow rate of the gas and the power are indicated by a value per length of 100 mm of the opening portion. The reason is that it is considered appropriate to input an amount which is proportional to the length of the opening portion, when determining parameters of the flow rate of the gas and the power.

As described above, according to the present embodiment, a configuration is adopted in which substrate 1 is close to elongated thermal plasma, and in which plasma is directly emitted to substrate 1 by using both sides of two long linear portions configuring elongated chamber 7, thereby providing excellent efficiency in utilizing gas and high-frequency power. That is, when high-temperature thermal processing is uniformly performed in the vicinity of the substrate surface for a very short period of time, or when low-temperature plasma, processing for the substrate is performed by emitting plasma using reactive gas or by concurrently emitting the plasma with a reactive gas flow, fast processing can be performed, and the plasma can be stably utilized.

Embodiment 4

Hereinafter, Embodiment 4 will be described with reference to FIGS. 7A to 7E.

Figure 7A:
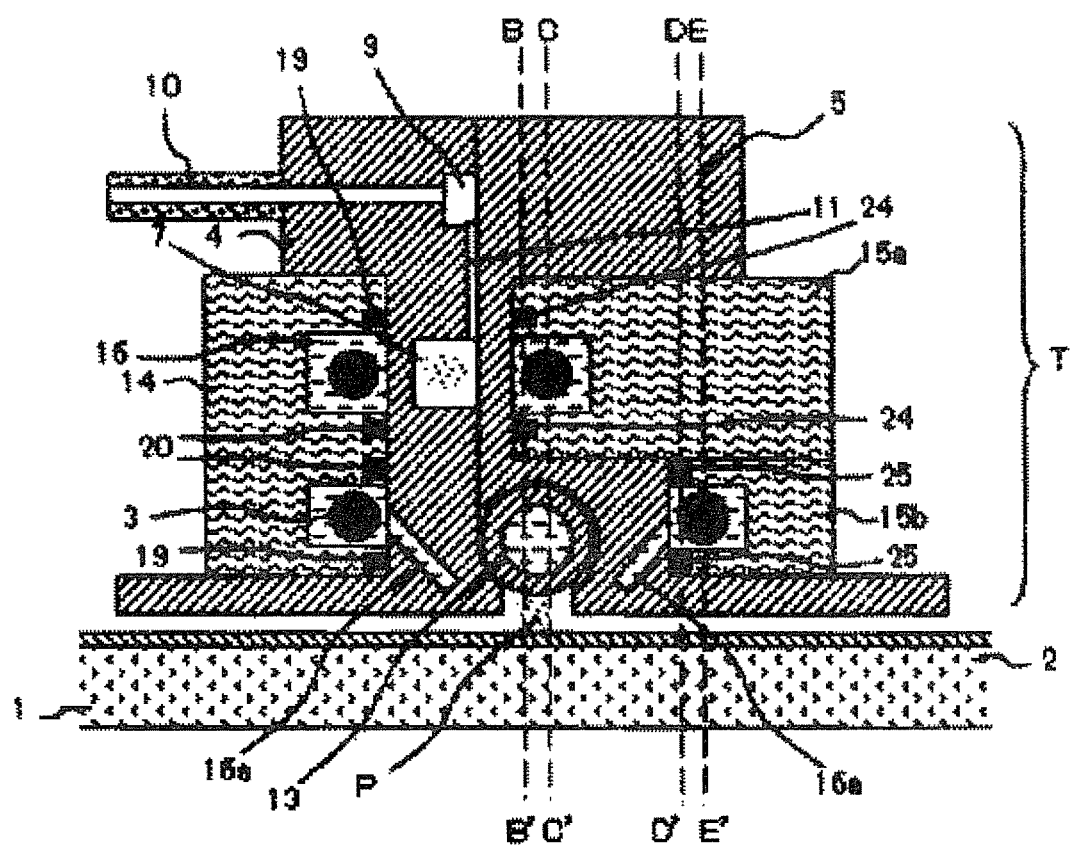
FIGS. 7A to 7E are sectional views illustrating a configuration of a plasma processing apparatus according to Embodiment 4.

FIG. 7A illustrates a configuration of a plasma processing apparatus according to Embodiment 4, and is a sectional view taken along a plane which is perpendicular to the longitudinal direction of an elongated inductively-coupled plasma torch unit and passes through dotted line A-A' in FIGS. 7B to 7E.

Figure 7B:
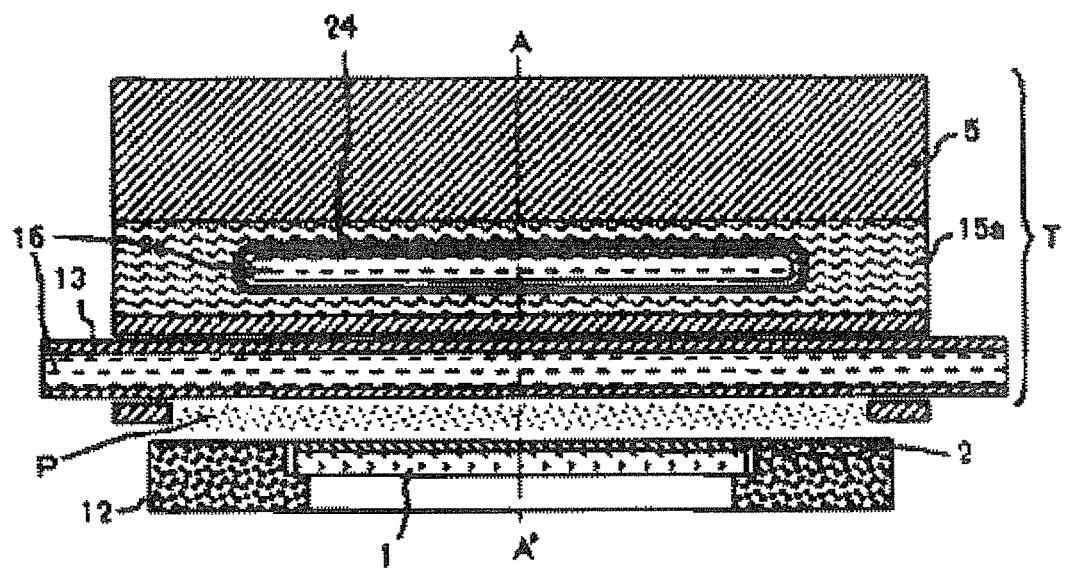
Figure 7C:
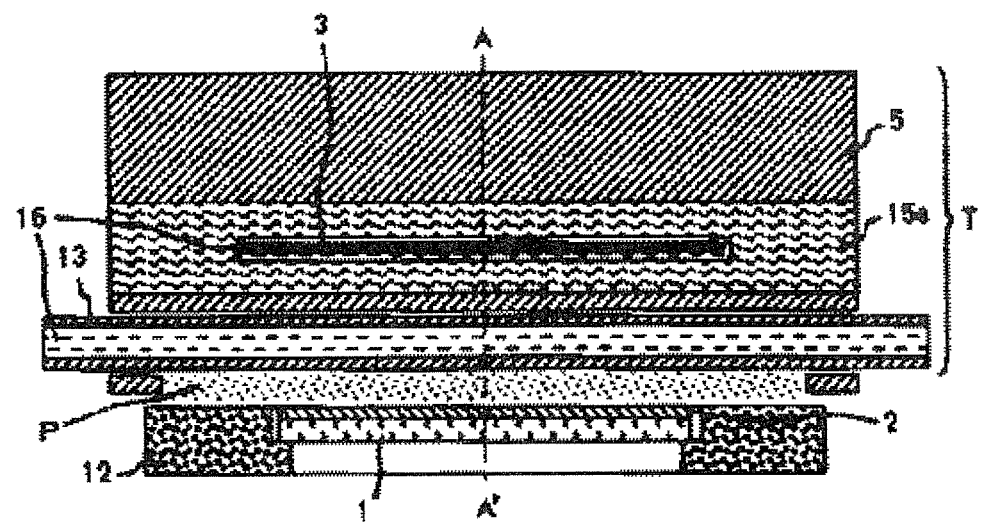
Figure 7D:
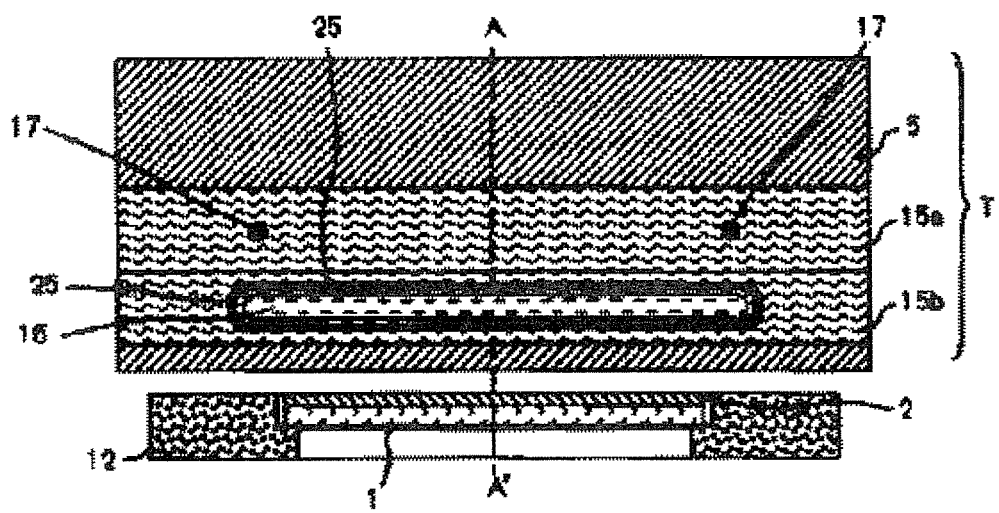
Figure 7E:
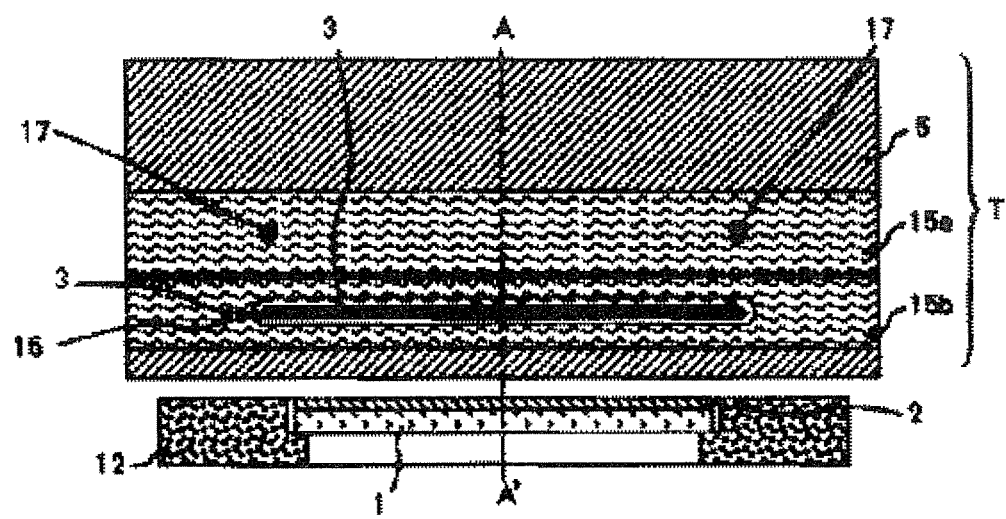

FIGS. 7B to 7E are sectional views taken along a plane which is parallel to the longitudinal direction of the elongated inductively-coupled plasma torch unit and passes through dotted lines in FIG. 7A. FIG. 7B is a sectional view taken along dotted line B-B' in FIG. 7A. FIG. 7C is a sectional view taken along dotted line C-C' in FIG. 7A. FIG. 7D is a sectional view taken along dotted line D-D' in FIG. 7A. FIG. 7E is a sectional view taken along dotted line E-E' in FIG. 7A.

A point which is different from Embodiment 1 is the shape of coil 3 and refrigerant flow path 16. Coil 3 which is close to second ceramic block 5 and is arranged inside a groove disposed in fourth ceramic blocks 15a and 15b is arranged stepwise so as to be closer to chamber 7 as much as possible in FIG. 7A. In order to adopt this configuration, fourth ceramic block is configured to include upper side ceramic block 15a and lower side ceramic block 15b, and independent refrigerant flow path 16, and O-rings 24 and 25 are respectively arranged therein. As illustrated, in FIGS. 7C and 7E, coil 3 is also vertically divided into two linear portions.

Refrigerant flow path 16 is configured to communicate with groove portion 16a which is dug in an oblique direction toward substrate 1 so as to be capable of effectively cooling first ceramic block 4 and second ceramic block 5 in the vicinity of the opening portion.

Embodiment 5

Hereinafter, Embodiment 5 will be described with reference to FIG. 8.

Figure 8:
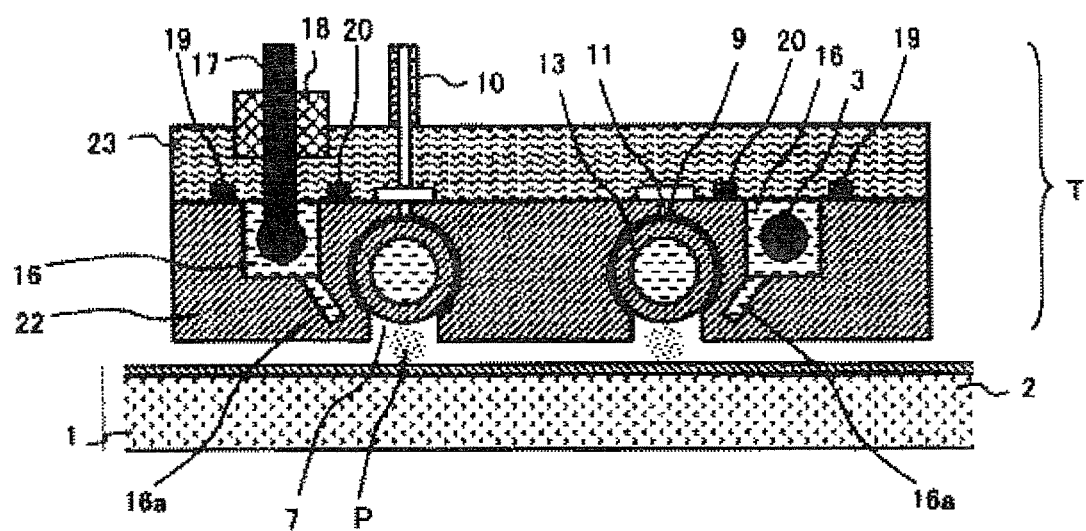
FIG. 8 is a sectional view illustrating a configuration of a plasma processing apparatus according to Embodiment 5.

FIG. 8 illustrates a configuration of a plasma processing apparatus according to Embodiment 5, is a sectional view taken along a plane which is perpendicular to the longitudinal direction of an elongated inductively-coupled plasma torch unit, and corresponds to FIG. 5A.

A point which is different from Embodiment 3 is the shape of refrigerant flow path 16. Refrigerant flow path 16 is configured to communicate with groove portion 16a which is dug in the oblique direction toward substrate 1 so as to be capable of effectively cooling first ceramic block 22 in the vicinity of the opening portion.

The above-described plasma processing apparatus and method merely show a typical example within the applicable scope of the various embodiments.

For example, inductively-coupled plasma torch unit T may scan substrate mounting table 12 which is fixed. However, substrate mounting table 12 may scan inductively-coupled plasma torch unit T which is fixed.

According to various configurations, it becomes possible to perform high-temperature processing in the vicinity of the surface of substrate 1. As a matter of course, these configurations are applicable to crystallization of TFT semiconductor films or reforming of solar cell semiconductor films which are disclosed in the related art. These configurations can also be applied to various types of surface processing such as oxidation and activation of silicon semiconductor integrated circuits, annealing for forming silicide, cleaning and reduced degassing of a protection layer in plasma display panels, surface planarization and reduced degassing of a dielectric layer containing aggregated silica particulates, reflow of various electronic devices, and plasma doping using a solid impurity source.

As a method for manufacturing solar cells, these configurations can also be applied to a method in which polycrystalline silicon films are obtained by coating a substrate upper surface with powder obtained by pulverizing a silicon ingot, and by emitting plasma to the powder so as to be melted.

In order to facilitate description, the term "thermal plasma" has been used. However, it is difficult to strictly distinguish between the thermal plasma and low-temperature plasma. For example, as explained, in pages 479 to 483, No. 8, Vol. 82 (2006), Journal published by Institute of Plasma Science and Nuclear Research, "Non-Equilibrium in Thermal Plasma" written by Yasunori Tanaka, it is difficult to distinguish between types of plasma by using only thermal equilibrium.

One concern of the present disclosure is to perform thermal processing on a substrate. Without being bound by terms such as thermal plasma, thermal equilibrium plasma, and high-temperature plasma, the various embodiments are applicable to a technique for emitting high-temperature plasma to the substrate. As described above, an inductively-coupled plasma torch may employ two modes for weak discharge and strong discharge. However, it is conceivable that the various embodiments are intended, to effectively utilize the strong discharge.

A case has been described in detail as an example where nigh-temperature thermal processing is uniformly performed in the vicinity of the substrate surface for a short period of time. However, the various embodiments are also applicable in a case where low-temperature plasma processing for the substrate is performed by emitting plasma using reactive gas or by concurrently emitting the plasma with a reactive gas flow. It is possible to realize etching or CVD by mixing the plasma gas with the reactive gas and by emitting the plasma using the reactive gas to the substrate.

Alternatively, while noble gas as the plasma gas or gas obtained by adding a small amount of H2 gas to the noble gas is used, gas containing the reactive gas as shielding gas is supplied. In this manner, it is possible to realize plasma processing such as etching, CVD, and doping by concurrently emitting the plasma with a reactive gas flow to the substrate. If gas which mainly contains argon as the plasma gas is used, thermal plasma is generated as described in detail in the embodiments.

In contrast, if gas which mainly contains helium as the plasma gas is used, plasma having a relatively low temperature can be generated. According to this method, it is possible to perform processing such as etching and film formation without heating a substrate too much. The reactive gas used in the etching includes halogen-containing gas, for example, CxFy (x and y are natural numbers), SF6, or the like. The reactive gas can be used in etching silicon or silicon compounds. If O2 is used as the reactive gas, it is possible to remove organic materials or to perform resist ashing. The reactive gas used for CVD includes monosilane, disilane, or the like, and can be used in film formation of silicon or silicon compounds.

Alternatively, if mixed gas of O2 and organic gas containing silicon represented by tetraethoxysilane (TEOS) is used, if is possible to form a silicon oxide film. In addition, it is possible to perform various types of low-temperature plasma processing such as surface processing for reforming water repellency and hydrophilic properties. Unlike in the related art using capacity-coupled atmospheric pressure plasma, inductively-coupled plasma is employed. Accordingly, even when nigh power density per unit of volume is input, arc discharge is less likely to occur, and plasma having higher density can be generated. As a result, a fast reaction speed can be achieved, and thus it is possible to quickly and efficiently perform entire processing for a desired processing target area of a substrate.

As described above, the various embodiments are applicable to crystallization of TFT semiconductor films or reforming solar cell semiconductor films. As a matter of course, the above embodiments are applicable to various types of surface processing such as cleaning and reduced degassing of a protection layer in plasma display panels, surface planarization and reduced degassing of a dielectric layer containing aggregated silica particulates, reflow of various electronic devices, and plasma doping using a solid impurity source. When high-temperature thermal processing is uniformly performed in the vicinity of the substrate surface for a very short period of time, fast processing can be performed, and the plasma can be stably utilized. In this regard, the above embodiments are advantageously applicable.

In addition, through low-temperature plasma processing such as etching, film forming, doping, surface reforming when various electronic devices are manufactured, it is possible to quickly and efficiently perform entire processing for a desired processing target area of a substrate. In this regard, the above embodiments are also advantageously applicable.

What is claimed is:

1. A plasma processing apparatus which uses an inductively-coupled plasma torch, comprising:
    an elongated and annular chamber that is surrounded with a dielectric member except for an opening portion, and that communicates with the opening portion;
    a gas supply pipe that introduces gas into the chamber;
    a coil that is disposed in the vicinity of the chamber;
        a high-frequency power source that is connected to the coil to generate inductively-coupled plasma; and
        a substrate mounting table,
        wherein within the dielectric member surrounding the chamber, a portion configuring a surface which opposes the substrate mounting table is configured to include a cylinder arranged parallel to a longitudinal direction of the chamber; and
    a rotary mechanism that rotates the cylinder around an axis of the cylinder,
    wherein the annular chamber has a closed continuous string shape including straight lines which form two short sides connected to both ends of linear portions which form two long sides, and
    wherein an uppermost side, relative to the substrate mounting table, among the two short sides and two long sides of the annular chamber is connected to the gas supply pipe.

2. The plasma processing apparatus of claim 1, wherein the cylinder is a pipe having a cavity formed thereinside, and includes a mechanism for causing a refrigerant to flow into the cavity formed inside the cylinder.

3. The plasma processing apparatus of claim 1, wherein the cylinder is longer than the chamber in the longitudinal direction.

4. The plasma processing apparatus of claim 1, wherein the cylinder has a structure in which multiple cylindrical components are joined together in the longitudinal direction of the chamber.

5. The plasma processing apparatus of claim 1, wherein the chamber is arranged along a plane which is substantially perpendicular to a plane formed by the substrate mounting table.

6. The plasma processing apparatus of claim 1, wherein the chamber is arranged along a plane which is substantially parallel to a plane formed by the substrate mounting table.

* * * * *